(12) United States Patent
Vicich et al.

(10) Patent No.: US 7,377,795 B2
(45) Date of Patent: May 27, 2008

(54) ELECTRICAL CONTACTS HAVING SOLDER STOPS

(75) Inventors: Brian Vicich, Prospect, KY (US); Steve Koopman, Floyds Knobs, IN (US)

(73) Assignee: Samtec, Inc., New Albany, IN (US)

( * ) Notice: Subject to any disclaimer, the term of this patent is extended or adjusted under 35 U.S.C. 154(b) by 0 days.

(21) Appl. No.: 11/565,949

(22) Filed: Dec. 1, 2006

(65) Prior Publication Data

US 2007/0093146 A1   Apr. 26, 2007

Related U.S. Application Data

(62) Division of application No. 11/071,774, filed on Mar. 3, 2005, now Pat. No. 7,172,438.

(51) Int. Cl.
*H05K 1/18* (2006.01)
(52) U.S. Cl. .......................................... 439/83; 439/886
(58) Field of Classification Search .................. 439/83, 439/876, 886
See application file for complete search history.

(56) References Cited

U.S. PATENT DOCUMENTS

| 3,686,625 A | 8/1972 | Krehbiel, Sr. et al. |
|---|---|---|
| 3,786,172 A | 1/1974 | Conley |
| 3,864,004 A | 2/1975 | Friend |
| 3,887,760 A | 6/1975 | Krieger et al. |
| 4,077,692 A | 3/1978 | Ellis et al. |
| 4,183,611 A | 1/1980 | Casciotti et al. |
| 4,345,814 A | 8/1982 | Gutbier et al. |
| 4,357,069 A | 11/1982 | Milora |
| 4,560,221 A | 12/1985 | Olsson |
| 4,722,470 A | 2/1988 | Johary |
| 4,846,734 A | 7/1989 | Lytle |
| 4,864,079 A | 9/1989 | Barlow |
| 4,934,961 A | 6/1990 | Piorunneck et al. |
| 4,948,030 A | 8/1990 | Chason et al. |
| 5,029,748 A | 7/1991 | Lauterbach et al. |
| 5,288,959 A | 2/1994 | Henschen |
| 5,334,422 A | 8/1994 | Myers et al. |
| 5,334,804 A | 8/1994 | Love et al. |

(Continued)

FOREIGN PATENT DOCUMENTS

DE   37 12 691 C1   6/1998

OTHER PUBLICATIONS

NAS Electronics; Micro Circuit Edge Clips; Catalog No. 3; Sep. 1984.

(Continued)

*Primary Examiner*—Gary F. Paumen
(74) *Attorney, Agent, or Firm*—Keating & Bennett, LLP

(57) ABSTRACT

An electrical contact for use in an electrical connector, includes a contact body made of metal and having a contact head, a contact tail, and an anti-wicking region disposed between the contact head and the contact tail arranged to prevent wicking of a fusible material past the anti-wicking region in a direction toward the contact head. The anti-wicking region is defined by one of a laser-ablated portion, a laser marking material, a UV marking material, and an ink that is permanently disposed on the contact body.

20 Claims, 12 Drawing Sheets

U.S. PATENT DOCUMENTS

| | | |
|---|---|---|
| 5,367,124 A | 11/1994 | Hoffman et al. |
| 5,453,017 A | 9/1995 | Belopolsky |
| 5,484,962 A * | 1/1996 | Gamo ................ 174/261 |
| 5,536,362 A | 7/1996 | Love et al. |
| 5,571,593 A | 11/1996 | Arldt et al. |
| 5,669,997 A | 9/1997 | Robbert et al. |
| 5,730,606 A | 3/1998 | Sinclair |
| 5,741,144 A | 4/1998 | Elco et al. |
| 5,788,539 A | 8/1998 | Fedder |
| 5,817,973 A | 10/1998 | Elco |
| 6,024,584 A | 2/2000 | Lemke et al. |
| 6,042,389 A | 3/2000 | Lemke et al. |
| 6,075,223 A | 6/2000 | Harrison |
| 6,079,991 A | 6/2000 | Lemke et al. |
| 6,093,035 A | 7/2000 | Lemke et al. |
| 6,164,983 A | 12/2000 | Lemke et al. |
| 6,241,535 B1 | 6/2001 | Lemke et al. |
| 6,313,436 B1 | 11/2001 | Harrison |
| 6,325,644 B1 | 12/2001 | Lemke et al. |
| 6,338,104 B1 * | 1/2002 | Iwasaki ................ 710/36 |
| 6,358,068 B1 | 3/2002 | Houtz |
| 6,439,900 B1 * | 8/2002 | Sward ................ 439/131 |
| 6,630,631 B1 | 10/2003 | Dishongh et al. |
| 6,759,142 B2 | 7/2004 | Hara et al. |
| 6,852,948 B1 | 2/2005 | Harrison |
| 6,855,910 B2 | 2/2005 | Harrison |
| 6,957,963 B2 | 10/2005 | Rathburn |
| 6,981,880 B1 | 1/2006 | Brodsky et al. |
| 6,998,540 B2 | 2/2006 | Belke et al. |
| 2005/0103761 A1 | 5/2005 | Miki et al. |
| 2006/0196857 A1 | 9/2006 | Vicich et al. |

OTHER PUBLICATIONS

E.A. Gutbier et al.; "More Reliable Connections to Condensation-Soldered Terminals"; Solid State Technology; Oct. 1982; pp. 99-104.

Teka Interconnection System; "PCMCIA Connectors wih Solder-Bearing Leads"; "PCMCIA Solder-Bearing Lead Connector Soldering Equipment"; pp. 1-10.

http://www.delphion.com/cgi-bin/patsearch; Clavez et al.; "Solder Stop for Contact Pin"; IBM Technical Disclosure Bulletin; Article 67C 01083; Jun. 1967.

SAMTEC; Surface Mount Solution Features; Apr. 1992.

NAS; drawing for Hewlett Packard; Mar. 1991.

SAMTEC; Surface Mount Solution Features; Apr. 1993.

R.J. Klein Wassink; "Soldering in Electronics Second Edition A Comprehensive Treatise on Soldering Technology for Surface Mounting and Through-hole Techniques"; Electrochemical Publications Limited; 1989; pp. 616-622, 698, and 700.

* cited by examiner

FIG. 3A
FIG. 3B
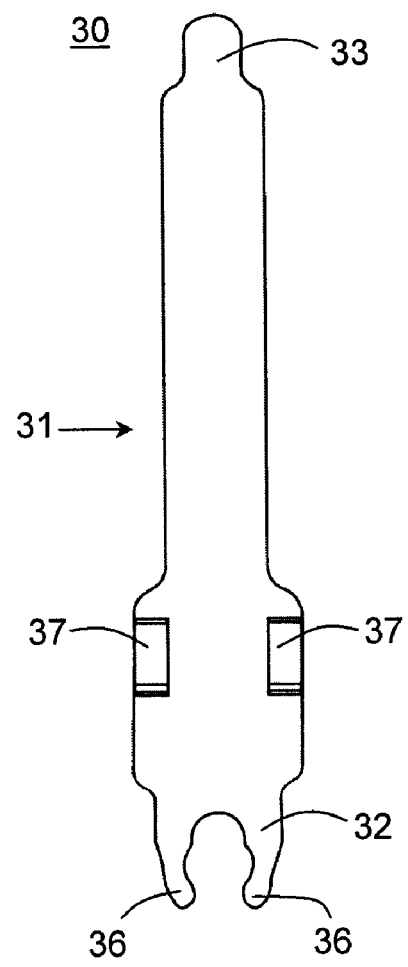
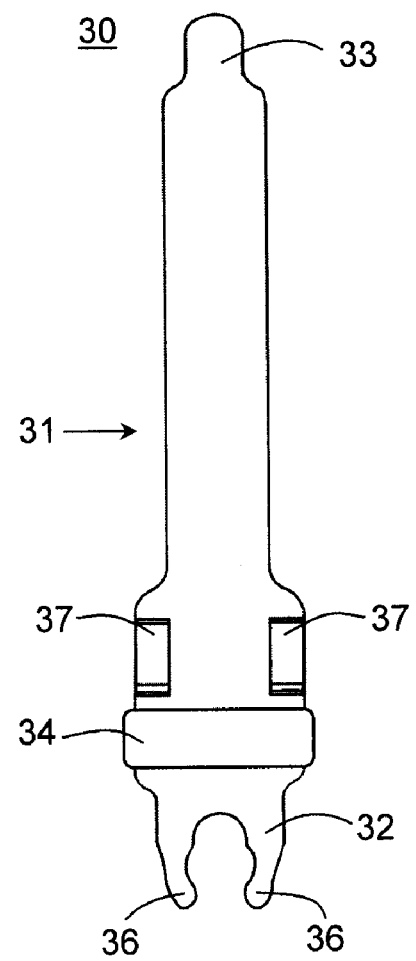

FIG. 3C
FIG. 3D
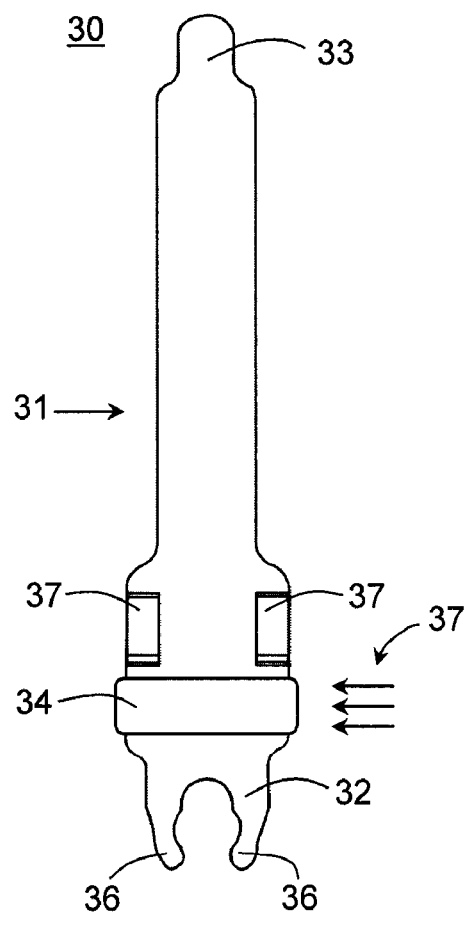
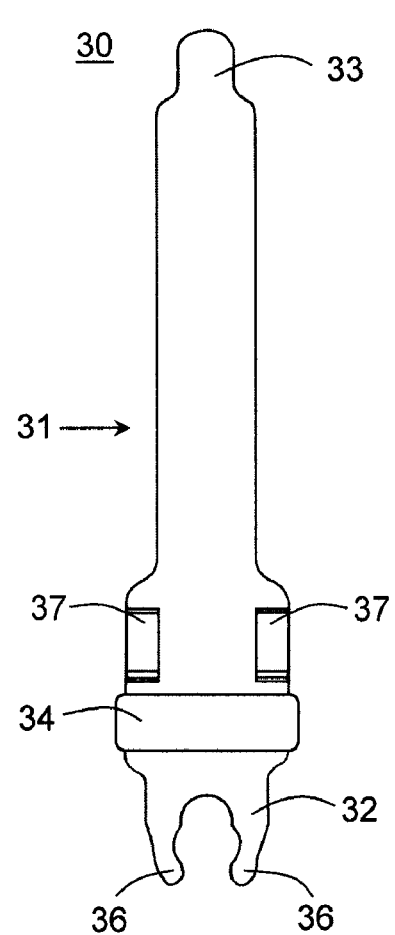

FIG. 3G
FIG. 3H
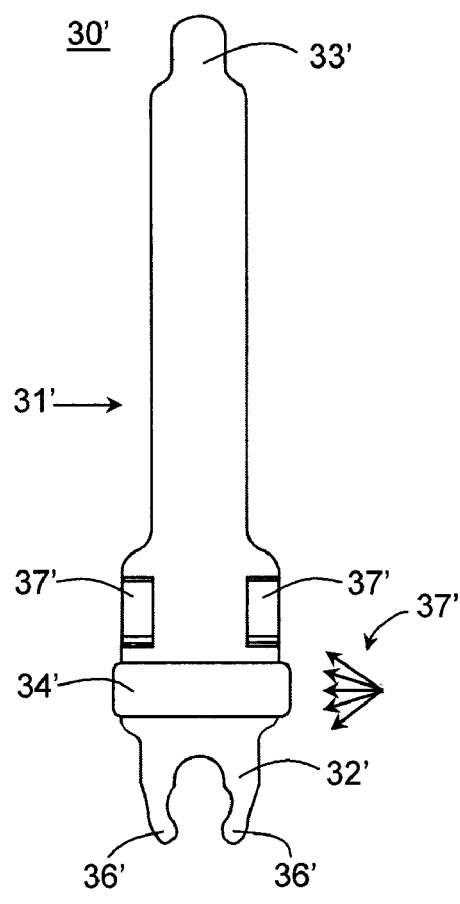
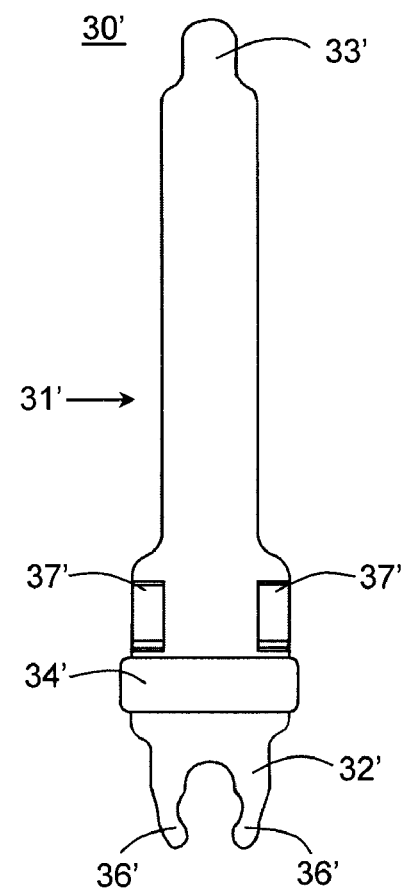

ELECTRICAL CONTACTS HAVING SOLDER STOPS

This application is a Divisional Application of U.S. patent application Ser. No. 11/071,774 filed Mar. 3, 2005, currently pending.

BACKGROUND OF THE INVENTION

1. Field of the Invention

The present invention relates to solder stops. More specifically, the present invention relates to solder stops on electrical contacts and to methods of making electrical contacts having solder stops.

2. Description of the Related Art

As shown in FIG. 6, it is well known in the art to use solder 64 to form an electrical connection between a connection pad 65 on a printed circuit board 66 and the contact tail 63 of an electrical contact 60. When the solder 64 is reflowed to join the contact tail 63 of the electrical contact 60 to the connection pad 65 on the printed circuit board 66, the solder 64 will wick up the length of the contact body 61, which reduces the amount of solder 64 located between the contact tail 63 of the electrical contact 60 and connection pad 65 on the printed circuit board 66.

The reduction in the amount of solder has the following disadvantageous effects: (a) causes a reduction in the electrical performance of the electrical connection between the electrical contact and the printed circuit board; (b) causes a reduction in the integrity of the mechanical connection between the electrical contact and the printed circuit board; (c) hinders mating of the electrical contact with the printed circuit board; and (d) reduces the aesthetics of the completed mechanical connection.

Several techniques are known in the art to prevent solder wicking, and more specifically, to prevent solder from wicking up along the length of the contact body of an electrical connector. First, it is known to use a nickel barrier to prevent solder wicking. Nickel is known as a solder anti-wicking material. A typical electrical contact is formed by coating or plating a base layer of copper or copper alloy with a nickel layer. The nickel layer is then coated or plated with an additional layer of tin, gold, or silver.

In order to use the nickel layer as an anti-wicking layer, selective plating, belt masking, spot plating, and controlled depth plating are typically required. In selective plating, the additional layer must be selectively plated such that a portion of the nickel layer is left exposed. This is accomplished by using removable mask materials such that a portion of the nickel layer is covered when the additional layer is plated. After the additional layer is plated, the removable mask materials are removed, along with the additional layer, such that the nickel layer is exposed.

In belt masking, the contact is pinched between two belts. Then, the portion of the contact that is not pinched between the belts is plated.

In spot plating, the contact is pinched between two specialized belts. Specialized belts used in spot plating are different than the belts used in belt masking because they have an opening in which a plating solution is sprayed through. Thus, only the region of the contact exposed by the opening of the specialized belt is plated.

In controlled depth plating, the contact is suspended at a given height with the contact partially submerged in a plating bath. The contact is plated only where the contact is submerged in the plating bath.

A problem with these techniques is that it is hard to accurately plate the additional layer such that nickel layer is exposed in a location that is most effective for preventing the wicking of the solder. This problem increases the cost of production of any contact that uses the above-described techniques. An additional problem with these techniques is that exposed nickel is not a very effective anti-wicking material.

It is known that the anti-wicking characteristic of nickel is improved by oxidizing the nickel. However, the flux used to facilitate soldering acts as an activating agent that helps to remove impurities and re-activates the surface. Thus, the flux reduces the effectiveness of the oxidized nickel as an anti-wicking material.

It is also known to use a post-plating punch to prevent solder wicking. After the contact is plated, a hole is punched into the contact such that the base layer of copper or copper alloy is exposed. The hole with the exposed base layer physically prevents solder from wicking up the contact around the hole. This is a mechanical solution as opposed to a chemical solution to the solder wicking problem.

A problem with this technique is that the hole in the contact acts to degrade any electrical signal traveling through the contact and to degrade the mechanical strength of the contact. Another problem with this technique is the cost of the secondary process of punching a hole during manufacturing of the contact.

Further, it is also known to use selective plating using an ink mask to prevent solder wicking. Before the contact is plated, an ink is printed onto the base layer of copper or copper alloy. The contact is then plated with metal. Any metal used during the plating will not adhere to the ink. After the plating is completed, the ink is removed to expose the copper or copper alloy, and thus, the ink is not a permanent part of the contact, but instead is only temporarily used during the contact manufacturing process. Thus, the contact has a portion in which the base layer of copper or copper alloy is exposed and oxidized. Solder is prevented from wicking because of the oxidization of the copper or copper alloy.

A problem with this technique is that it is very costly because of the materials and processes used.

In addition, it is known to use a post assembly applied solder mask to prevent solder wicking. That is, after the contact has been assembled, a solder mask, for example, Kapton Tape or fluorine coating, is applied to the contact to prevent wicking.

Some problems with this technique are the cost associated with the additional assembly step and the cost of the solder mask. Another problem with this technique is that not all electrical connectors are arranged such that enough space is available to add the tape.

It is also known to use molded plastic disposed around the contact to prevent solder wicking. A plastic dam is molded around the contact such that a physical barrier is created around the circumference of the contact to prevent the solder from passing.

A problem with this technique is that an additional assembly step is required, which increases the time and labor costs for producing a contact. Another problem with this technique is that it will add extra height to the electrical connector, which will make it unsuitable in situations were an electrical connector having a low profile is needed.

It is further known to press fit the tail of a contact into plastic having a cross-section similar to the cross-section of the contact to prevent solder wicking. The tail of the contact is pressed into an opening in the plastic such that friction keeps the contact in place.

A problem with this technique is that an effective anti-wicking barrier is not created because the opening into which the tail is pressed does not conform precisely to the circumference of the contact. Another problem with this technique is that it is difficult to apply this technique to SMT (Surface Mount Technology) connectors because there is not sufficient space to add the plastic.

Other problems with the above techniques are that excessive materials can inadvertently be used and that the materials can be inadvertently removed during post reflow cleaning. Further, these materials may interfere with the formation of a solder joint.

SUMMARY OF THE INVENTION

To overcome the problems described above, preferred embodiments of the present invention provide electrical contacts with improved anti-wicking characteristics, and also provide various methods of manufacturing such electrical contacts.

According to one preferred embodiment of the present invention, an electrical contact for use in an electrical connector includes a contact body made of metal and having a contact head, a contact tail, and an anti-wicking region disposed between the contact head and the contact tail arranged to prevent wicking of a fusible material past the anti-wicking region in a direction toward the contact head, wherein the anti-wicking region is defined by one of a laser-ablated portion, a laser marking material, a UV marking material, and an ink that is permanently disposed on the contact body.

It is preferred that the anti-wicking region is located closer to the contact tail than the contact head and that the anti-wicking region extends on at least both major surfaces of the electrical contact.

The contact body preferably includes a base layer and at least one contact layer, and possibly two or more contact layers. The at least one contact layer preferably includes at least one of a nickel layer, a tin layer, a silver layer, and a gold layer, and the base layer preferably includes one of copper and a copper alloy.

In a preferred embodiment in which the anti-wicking region is defined by the laser-ablated portion, the laser-ablated portion defines a roughened surface portion of the contact body.

It is preferred that the laser-ablated portion is oxidized.

In another preferred embodiment of the present invention where the anti-wicking region is defined by the laser marking material, the laser marking material is preferably disposed on one of (a) a base layer of the contact body, and (b) at least one contact layer disposed on the base layer of the contact body.

In another preferred embodiment of the present invention where the anti-wicking region is defined by the ink which is permanently disposed on the contact body, the ink is disposed on one of (a) a base layer of the contact body, and (b) at least one contact layer disposed on the base layer of the contact body.

It is preferred that the ink is one of a high temperature ink and a chemical resistant ink.

The electrical contact preferably includes a fusible element in the contact tail and the ink is resistant to a temperature of up to at least the reflow temperature of the fusible element.

According to another preferred embodiment of the present invention, a method of manufacturing an electrical contact includes forming a contact body of metal and so as to include a contact head, a contact tail, and an anti-wicking region disposed between the contact head and the contact tail arranged to prevent wicking of a fusible material past the anti-wicking region in a direction toward the contact head, wherein the anti-wicking region is formed by one of a laser-ablated portion, a laser marking material, a UV marking material, and an ink that is permanently formed on the contact body.

The step of forming the electrical contact preferably includes forming a base layer and at least one contact layer in direct contact with the base layer.

In a preferred embodiment of the present invention in which the anti-wicking region is formed of the laser-ablated portion, the laser-ablated portion is formed by irradiating a portion of the at least one contact layer such that a portion of the base layer is at least partially exposed and preferably oxidized. The laser-ablated portion preferably defines a roughened surface portion on the contact body. The step of irradiating is preferably performed using a laser, such as a YAG laser or a $CO_2$ laser. The at least one contact layer preferably includes at least one of a nickel layer, a tin layer, a silver layer, and a gold layer, and the base layer preferably includes one of copper and a copper alloy.

In another preferred embodiment of the present invention, the anti-wicking region is formed by the laser marking material and the laser marking material is formed by applying the laser marking material to a portion of the contact body and irradiating the laser marking material to fuse the laser marking material to the contact body, which is preferably performed using a laser such as a YAG laser or a $CO_2$ laser.

The laser marking material is preferably formed on one of (a) a base layer of the electrical contact, and (b) at least one contact layer disposed on the base layer of the electrical contact.

In another preferred embodiment of the present invention in which the anti-wicking region is formed by the UV marking material, the UV marking material is formed by applying the UV marking material to the contact body and irradiating the UV marking material to fuse the UV marking material to the contact body. The step of irradiating is preferably performed using a mercury lamp.

The UV marking material is preferably formed on one of (a) a base layer of the electrical contact, and (b) at least one contact layer disposed on the base layer of the electrical contact, and preferably formed to extend on at least both major surfaces of the contact body.

In a preferred embodiment of the present invention in which the anti-wicking region is formed by the ink that is permanently disposed on the contact body, the ink is preferably one of a high temperature ink and a chemical resistant ink, and the ink is preferably formed to extend on at least both major surfaces of the contact body, and preferably formed on one of (a) a base layer of the electrical contact, and (b) at least one contact layer disposed on the base layer of the electrical contact.

Other preferred embodiments relate to an electrical connector including such a novel electrical contact, and a method of manufacturing such an electrical connector.

In addition, further preferred embodiments of the present invention relate to an electronic apparatus including a substrate and an electrical connector including an electrical contact according to various preferred embodiments described above, and a method of manufacturing and assembling such a novel electronic apparatus.

Other features, elements, steps, characteristics and advantages of the present invention will become more apparent from the following detailed description of preferred embodiments of the present invention with reference to the attached drawings.

BRIEF DESCRIPTION OF THE DRAWINGS

FIGS. 3A-3D illustrate various steps of a method of manufacturing an electrical contact according to a third preferred embodiment of the present invention, and an electrical contact according to a fourth preferred embodiment of the present invention.

FIGS. 3E-3H illustrate a method of manufacturing an electrical contact according to a modification of the third preferred embodiment of the present invention, and an electrical contact according to a modification of the fourth preferred embodiment of the present invention.

DETAILED DESCRIPTION OF PREFERRED EMBODIMENTS

Figure 1A:
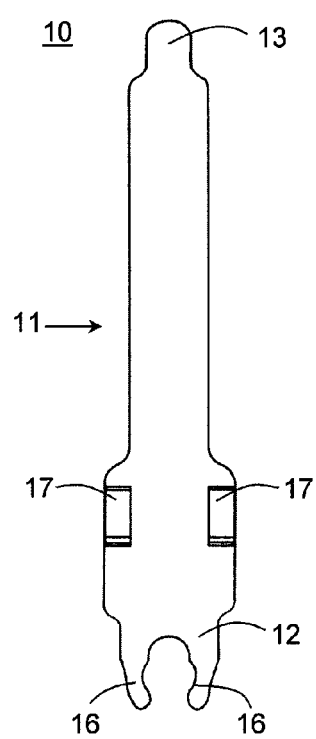
FIGS. 1A-1C illustrate various steps of a method of manufacturing an electrical contact according to a first preferred embodiment of the present invention, and an electrical contact according to a second preferred embodiment of the present invention.
Figure 1B:
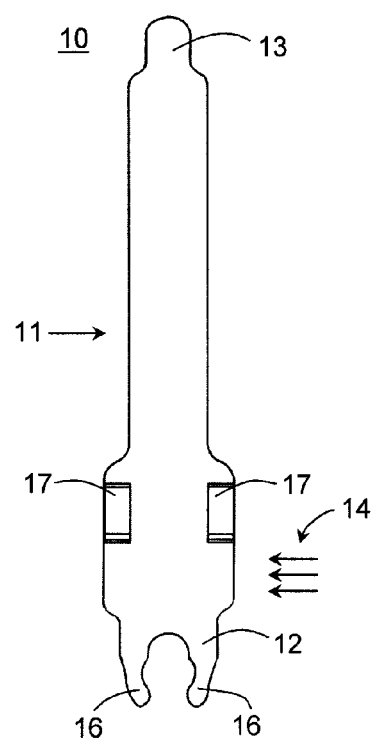
Figure 1C:
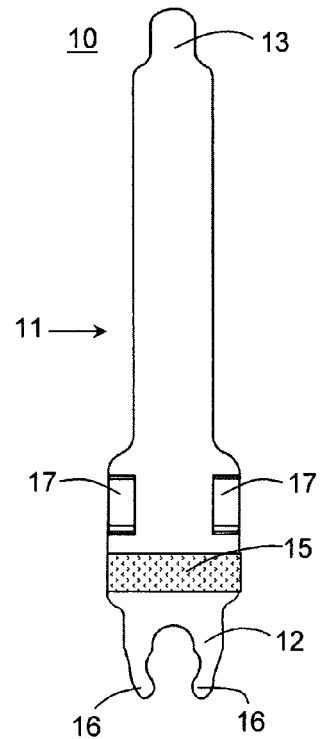
Figure 2:
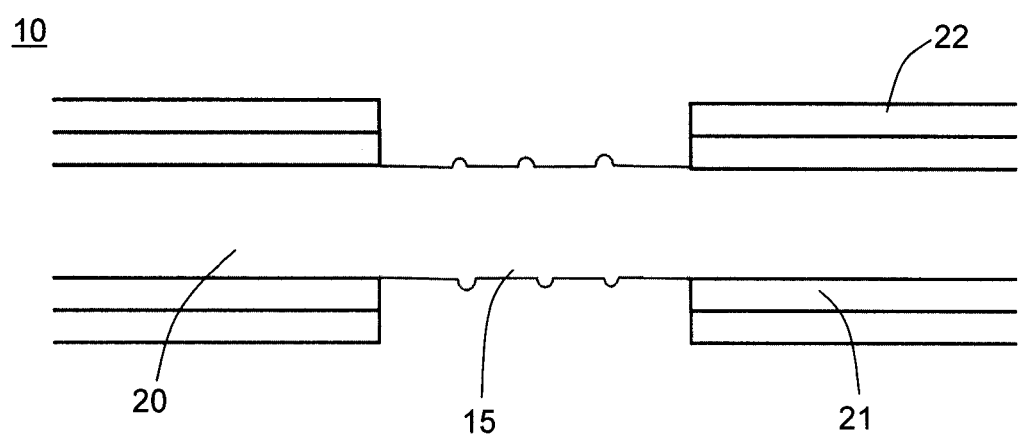
FIG. 2 is a close-up, sectional view of the contact according to the second preferred embodiment of the present invention.

FIGS. 1A-1C illustrate a method of manufacturing, according to a first preferred embodiment of the present invention, an electrical contact 10 according to a second preferred embodiment of the present invention. FIG. 2 illustrates a close-up sectional view of an anti-wicking region 15 of the electrical contact 10.

FIG. 1A illustrates the electrical contact 10 having a contact body 11. The contact body 11 includes a contact tail 12 and a contact head 13. As shown in FIG. 1A, the contact tail 12 includes arms 16 for holding a fusible material, such as solder or a solder member (not shown). However, other arrangements for attaching solder to the contact tail 12 could also be used for attaching the fusible material in the form of, for example, solder balls or solder charges. Further, the contact tail 12 need not include any arrangement for holding solder. Instead, the fusible material or solder could be provided on any substrate to which the electrical contact 10 is to be soldered.

The electrical contact 10 also can include a pair of wedges 17 for engaging a side wall of a core of an electrical connector (not shown in FIGS. 1A-1C) in order to fix the position of the electrical contact 10 in the electrical connector. Each of the electrical contacts 10 can further include a bump (not shown) for aiding in the positioning of the electrical contact 10 in an electrical connector. Instead of using wedges 17 and bumps to press fit the electrical contact 10 into an electrical connector as described above, electrical contacts 10 can be fixed in an electrical connector in any suitable manner, including insert-molding.

As shown in FIGS. 1B and 1C, a portion of the surface of the electrical contact 10 is removed to form an exposed portion to define an anti-wicking region 15 of the contact body 11. The electrical contact 10 does not need to be cleaned before forming the exposed portion at the anti-wicking region 15. The removal of the surface material at the exposed portion at the anti-wicking region 15 of the electrical contact 10 is preferably performed by laser ablation. The laser ablation is preferably accomplished by irradiating the surface of the electrical contact 10 with a laser 14 as shown in FIG. 1B. The laser is preferably a YAG (Yttrium Aluminum Garnet) or $CO_2$ laser, however, other suitable types of laser or sources of laser energy could be used.

The exposed portion at the anti-wicking region 15 is roughened and oxidized by the laser ablation. The location of the exposed portion at the anti-wicking region 15 can be accurately controlled by the use of laser optics (not shown). The accurate control of an exposed area or portion for defining the anti-wicking region 15 would be easily understood and achievable by one of skill in the art of laser processing of metal. Preferably, the exposed portion at the anti-wicking region 15 extends on both major surfaces of the contact body 11.

FIG. 1C illustrates the electrical contact 10 of the second preferred embodiment before solder is attached to the contact tail 12. As discussed above, FIGS. 1A-1C illustrate a method of forming the exposed portion defining the anti-wicking region 15 before solder is attached to the contact tail 12. However, this method could be performed after solder has been attached to the contact tail 12.

As shown in FIG. 2, the electrical contact 10 includes a base layer 20, a first contact layer 21, and a second contact layer 22. As shown in FIG. 2, a majority of the first contact layer 21 and the second contact layer 22 is preferably removed such that at least a portion of the base layer 20 is exposed to form the exposed portion that defines the anti-wicking region 15. That is, a portion of the first contact layer 21 and the second contact layer 22 may still remain on the base layer 20. Although not shown in FIG. 2, a portion of the base layer 20 could also be removed.

The base layer 20 can be made of copper or copper alloy, but other suitable materials could also be used as the base layer 20. When copper or copper alloy is used for the base layer 20, the copper or copper alloy will oxide as a result of the laser ablation, and the oxide of copper or copper alloy is highly resistant to solder flow or wicking. The first contact layer 21 can be made of nickel, but other suitable materials could also be used as the first contact layer 21. The second contact layer 22 can be gold, but other materials, such as tin and silver, can also be used as the second contact layer 22.

FIGS. 3A-3D illustrate a method of manufacturing, according to a third preferred embodiment of the present invention, and the electrical contact 30 according to a fourth preferred embodiment of the present invention.

FIG. 3A illustrates the electrical contact 30 having a contact body 31. The contact body 31 includes a contact tail 32 and a contact head 33. As shown in FIG. 3A, the contact tail 32 preferably includes arms 36 for holding a fusible material such as solder or a solder member (not shown). However, other arrangements for attaching solder to the contact tail 32 could also be used for attaching the fusible material in the form of, for example, solder balls or solder charges. Further, the contact tail 32 need not include any arrangement for holding solder. Instead, the fusible material or solder could be provided on any substrate to which the electrical contact 30 is to be soldered.

The electrical contact 30 also can include a pair of wedges 37 for engaging a side wall of a core of an electrical connector (not shown in FIGS. 3A-3D) in order to fix the position of the electrical contact 30 in the electrical connector. Each of the electrical contacts 30 can further include a bump (not shown) for aiding in the positioning of the electrical contact 30 in an electrical connector. Instead of using wedges 37 and bumps to press fit the electrical contact 30 into an electrical connector as described above, electrical contacts 30 can be fixed in an electrical connector in any suitable manner, including insert-molding.

First, the electrical contact 30 shown in FIG. 3A is cleaned. Preferably, high pressure water is sprayed onto the contact 30 in order to clean it. However, any other suitable method could be used to clean to the contact. Then, as shown in FIGS. 3B-3D, a laser marking material 34 is fused to the electrical contact 30. The location where the laser marking material 34 is located defines the anti-wicking region. FIG. 3B illustrates how a laser marking material 34 is applied to the electrical contact 30. Preferably, the laser marking material is Thermark™ made by TherMark L.L.C. or Cermark™ made by Ferro Corporation. U.S. Pat. Nos. 6,075,223, 6,313,436, 6,852,948, and 6,855,910 disclose typical laser marking materials. However, any suitable laser marking material could be used. The laser marking material 34 can be applied around the entire circumference of the contact body 31 by spraying the laser marking material 34 to define the anti-wicking region. The laser marking material 34 can also be applied to the major surfaces of the contact body 31 by using a brush (not shown) or a roller (not shown). The laser marking material can be applied by any means or process, including, but not limited to, brush, roller, aerosol can, and spray gun. The method of application of the laser marking material 34 will determine to what extent the laser marking material 34 is applied to the contact body 32

Then, as shown in FIG. 3C, the laser marking material 34 is irradiated with a laser 37. The laser 37 is preferably a YAG or $CO_2$ laser, but any other suitable laser source may be used. The irradiation of the laser marking material 34 by the laser 37 fuses the laser marking material 34 to the contact body 31. The location on the contact body 31 to which the laser marking material 34 is fused is accurately controlled by laser optics (not shown) to define the anti-wicking region in a desired location. Any laser marking material 34 that is not irradiated, i.e., not fused to the contact body 31, is then cleaned off and removed from the contact body 31. The fused laser marking material 34 shown in FIG. 3D is highly resistant to solder flow and thus is excellent for defining the anti-wicking region.

The laser marking material 34 can be fused to any one of the base layer (not shown), the first contact layer (not shown), and the second contact layer (not shown) of the electrical contact 30. The base layer, the first contact layer, and the second contact layer of the electrical contact 30 of the fourth preferred embodiment are preferably arranged in a similar manner as the base layer 20, the first contact layer 21, and the second contact layer 22 of the electrical contact 10 of the second preferred embodiment illustrated in FIG. 2 are arranged. If the laser marking material 34 is fused to either the base layer or the first contact layer of the electrical contact 30, the plating of an additional layer will not adhere to the fused laser marking material 34.

FIG. 3D illustrates the electrical contact 30 of the fourth preferred embodiment before solder is attached to the contact tail 32. As discussed above, FIGS. 3A-3D illustrate the method of forming the laser marking material 34 before solder is attached to the contact tail 32. However, this method of forming the laser marking material 34 could be performed after solder is attached to the contact tail 32.

Figure 3E:
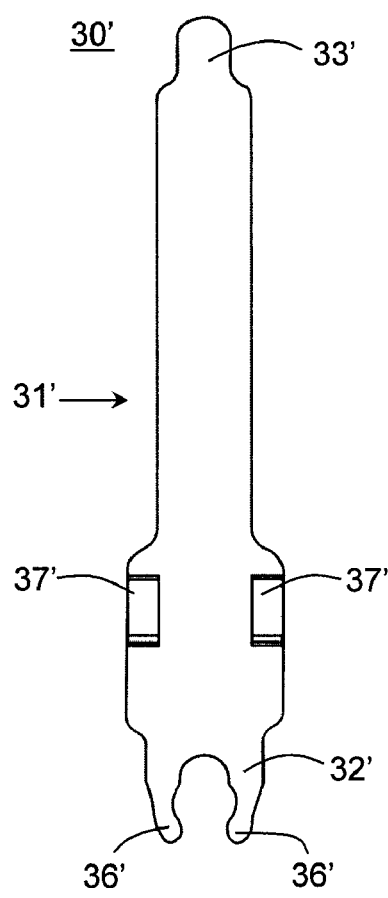

FIG. 3E illustrates an electrical contact 30', which is a modification of the electrical contact 30 illustrated in FIGS. 3A-3D, that has a contact body 31'. The contact body 31' includes a contact tail 32' and a contact head 33'. As shown in FIG. 3E, the contact tail 32' includes arms 36' for holding a fusible material such as solder or a solder member (not shown). However, other arrangements for attaching solder to the contact tail 32' could also be used for attaching a fusible material in the form of, for example, solder balls or solder charges. Further, the contact tail 32' need not include any arrangement for holding solder. Instead, the fusible material or solder could be provided on any substrate to which the electrical contact 30' is to be soldered.

Electrical contact 30' also can include a pair of wedges 37' for engaging a side wall of a core of an electrical connector (not shown in FIGS. 3E-3H) in order to fix the position of the electrical contact 30' in the electrical connector. Each of the electrical contacts 30' can further include a bump (not shown) for aiding in the positioning of the electrical contact 30' in an electrical connector. Instead of using wedges 37' to press fit the electrical contact 30' into an electrical connector as described above, electrical contacts 30' can be fixed in an electrical connector in any suitable manner, including insert-molding.

Figure 3F:
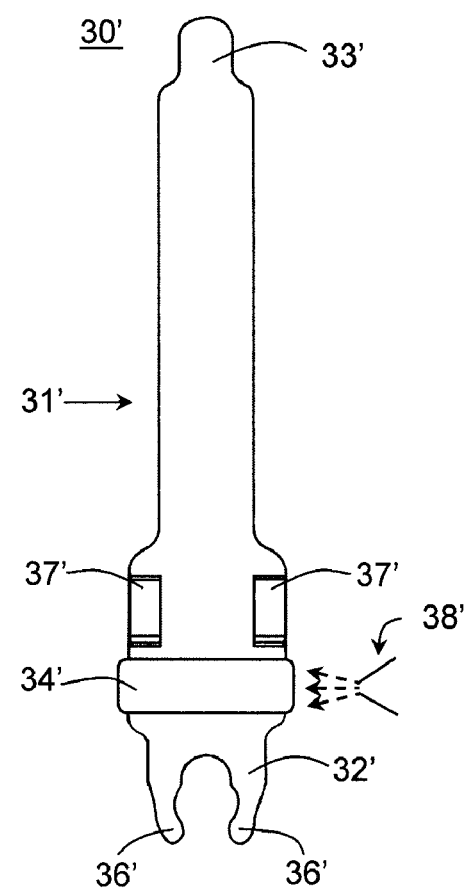

Instead of laser marking material 34, a UV marking material 34' could be used to define the anti-wicking region. Because the location on the contact body 31' to which the UV marking material 34' is fused cannot be accurately controlled and because all of the UV marking material 34' applied to the contact body 31' is fused to the contact body 31', the UV marking material must be carefully applied to the contact body 31' to define the anti-wicking region in a desired location. The UV marking material can be applied, as shown in FIG. 3F, with an ink jet 38'. However, any other suitable method may also be used. As shown in FIG. 3G, a UV emitting light source 37' is used instead of a laser 37 to fuse the UV marking material 34' to the contact body 31'. A typical UV emitting light source is a mercury lamp. However, any other suitable UV emitting light source could be used. The fused UV marking material 34' shown in FIG. 3H is highly resistant to solder flow and is excellent for defining the anti-wicking region on the contact body 31'.

The UV marking material 34' can be fused to any one of the base layer (not shown), the first contact layer (not shown), and the second contact layer (not shown) of the electrical contact 30'. The base layer, the first contact layer, and the second contact layer of the electrical contact 30' of the modification of the fourth preferred embodiment are arranged in a similar manner as the base layer 20, the first contact layer 21, and the second contact layer 22 of electrical contact 10 of the second preferred embodiment illustrated in FIG. 2 are arranged. If the UV marking material 34' is fused to either the base layer or the first contact layer of the electrical contact 30', the plating of an additional layer will not adhere to the fused UV marking material 34'.

FIG. 3H illustrates the electrical contact 30' of the modification of the fourth preferred embodiment before solder is attached to the contact tail 32'. As discussed above, FIGS. 3E-3H illustrate the method of forming the UV marking material 34' before solder is attached to the contact tail 32'. However, this method could be performed after solder is attached to the contact tail 32'.

Figure 4A:
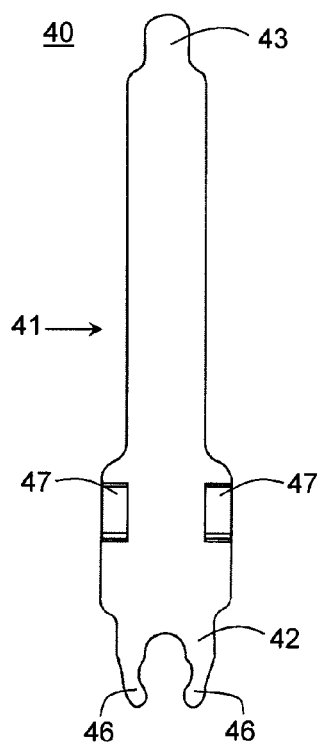
FIGS. 4A-4C illustrate a method of manufacturing an electrical contact according to a fifth preferred embodiment of the present invention, and an electrical contact according to a sixth preferred embodiment of the present invention.
Figure 4B:
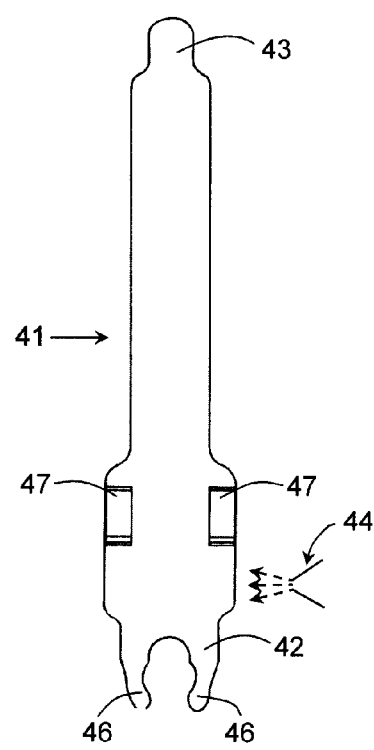
Figure 4C:
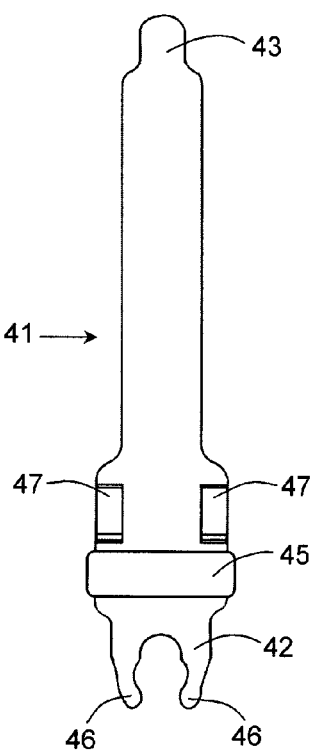

FIGS. 4A-4C illustrate a method of manufacturing, according to a fifth preferred embodiment of the present invention, and an electrical contact 40 according to a sixth preferred embodiment of the present invention.

FIG. 4A illustrates the electrical contact 40 having a contact body 41. The contact body 41 includes a contact tail 42 and a contact head 43. As shown in FIG. 4A, the contact tail 42 includes arms 46 for holding a fusible material such as solder or a solder member (not shown). However, other arrangements for attaching solder to the contact tail 42 could also be used for attaching the fusible material in the form of, for example, solder balls or solder charges. Further, the contact tail 42 need not include any arrangement for holding solder. Instead, the fusible material or solder could be provided on any substrate to which the electrical contact 40 is to be soldered.

The electrical contact 40 also can include a pair of wedges 47 for engaging a side wall of a core of an electrical connector (not shown in FIGS. 4A-4C) in order to fix the position of the electrical contact 40 in the electrical connector. Each of the electrical contacts 40 can further include a bump (not shown) for aiding in the positioning of the electrical contact 40 in an electrical connector. Instead of using wedges 47 and bumps to press fit the electrical contact 40 into an electrical connector as described above, electrical contacts 40 can be fixed in an electrical connector in any suitable manner, including insert-molding.

As shown in FIGS. 4B and 4C, an ink 45 is applied to the electrical contact 40 by an ink jet head 44 to define the anti-wicking region. FIG. 4B illustrates how an ink jet head 44 dispenses the ink 45 on the contact body 41. The location on the contact body 41 at which the ink 45 is applied is accurately controlled by the nozzle of the ink jet head 44 to precisely define the anti-wicking region on the contact body 41. The ink 45 is preferably a high temperature ink which is resistant to temperatures up to at least the reflow temperature of any solder (not shown) used to connect the electrical contact 40 to a substrate. Preferably, the ink 45 is applied to the major surfaces of the contact body 41 within the anti-wicking region. The ink 45 may also be applied to the minor surfaces of the contact body.

Other types of ink may be used for the ink 45 applied to the contact body 41. If the ink 45 is chemical resistant, the ink 45 may be applied to any one of the base layer (not shown), the first contact layer (not shown), and the second contact layer (not shown) of the electrical contact 40. The base layer, the first contact layer, and the second contact layer of the electrical contact 40 of the sixth preferred embodiment are arranged in a similar manner as the base layer 20, the first contact layer 21, and the second contact layer 22 of electrical contact 10 of the second preferred embodiment illustrated in FIG. 2 are arranged. If the chemical resistant ink 45 is applied to either the base layer or the first contact layer of the electrical contact 40, the plating of an additional layer will not adhere to the chemical resistant ink 45. During the plating process, the electrical contact 40 can be subjected to a caustic chemical bath, such as an acid bath, to clean the surface of the electrical contact 40. This is typically done in order to prepare the surface of the electrical contact 40 for plating. If a caustic chemical bath is used, the chemical resistant ink 45 will resist the caustic chemical or chemicals used in the bath, and thus will still remain on the contact body 41.

FIG. 4C illustrates the electrical contact 40 of the sixth preferred embodiment before solder is attached to the contact tail 42. As discussed above, FIGS. 4A-4C illustrate the method of forming the ink 45 before solder is attached to the contact tail 42. However, this method could be performed after solder is attached to the contact tail 42.

Figure 5A:
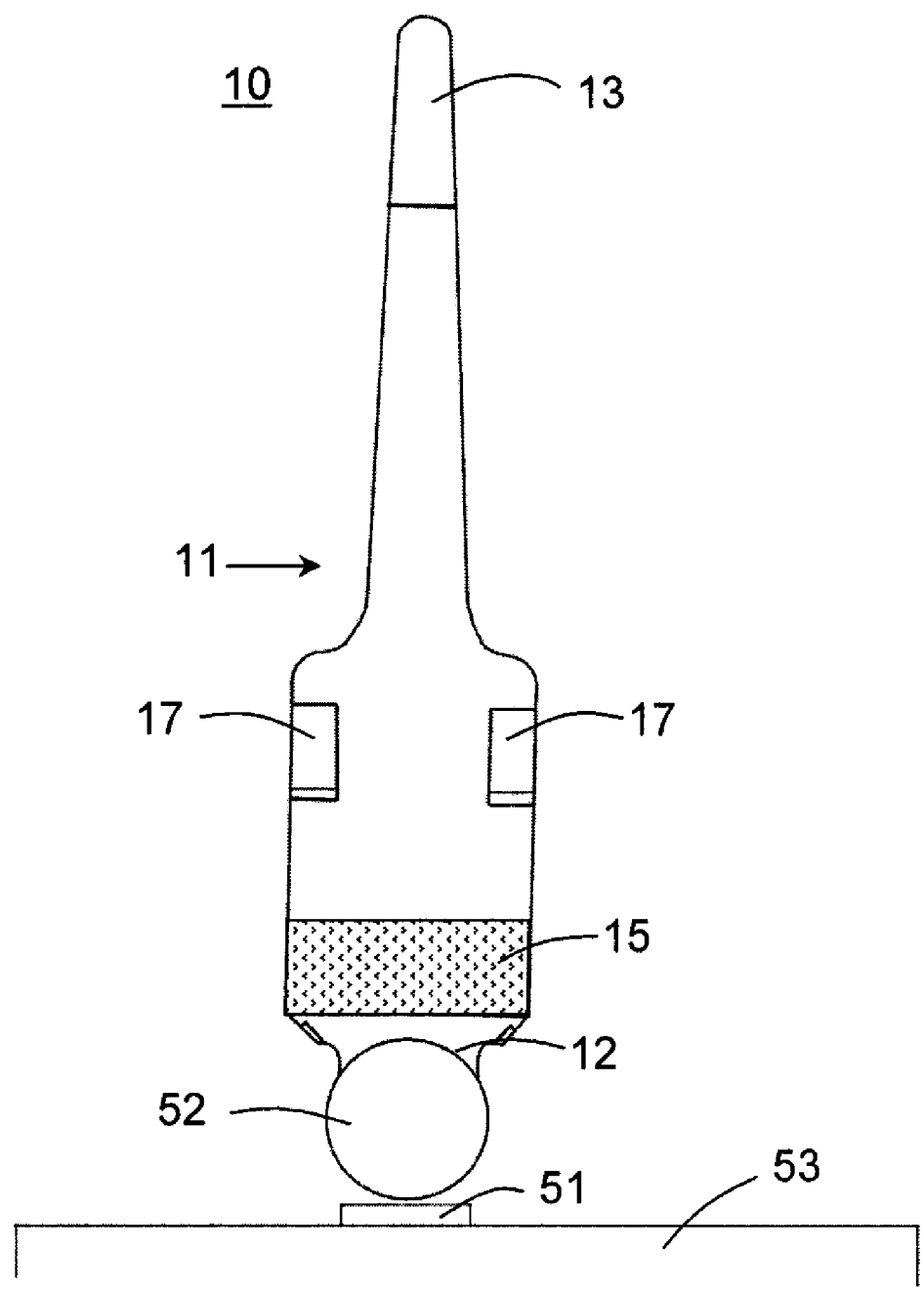
FIGS. 5A and 5B illustrate an electrical contact according to the second preferred embodiment before and after, respectively, it has been attached to a printed circuit board.
Figure 5B:
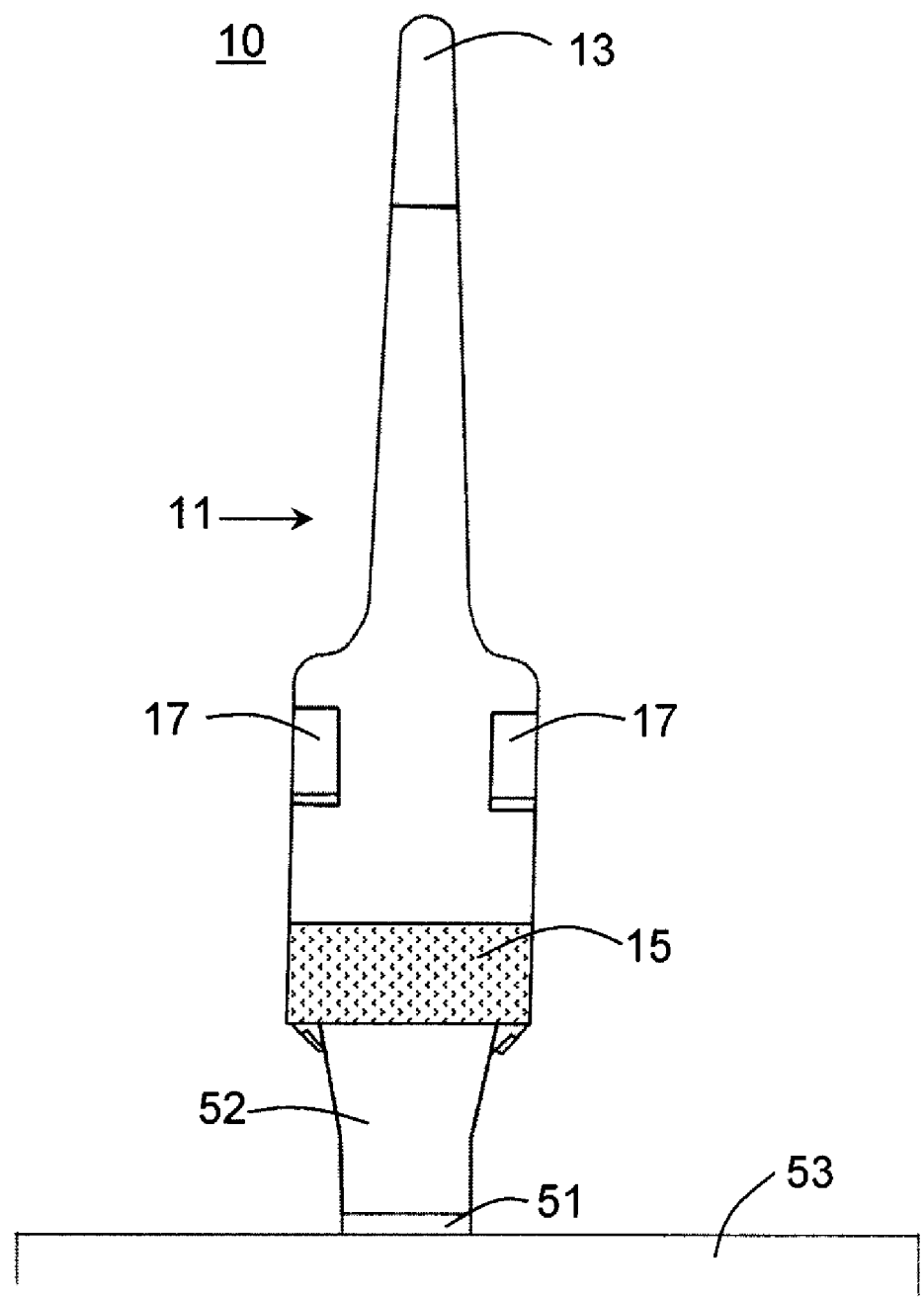

FIG. 5A illustrates the electrical contact 10 according to the second preferred embodiment in which a fusible material, i.e., solder 52, is attached to contact tail 12. As shown in FIG. 5B, the exposed portion of the contact body 11 defining the anti-wicking region 15 is formed in an area of the contact body 11 so that, when the solder is reflowed, the solder 52 will not flow past the anti-wicking region 15 and up along a length of the contact body 11 toward the contact head 13. The location and arrangement of the anti-wicking regions on the contact body 31, 31', 41 of the various preferred embodiments described above are preferably the same as that of the anti-wicking region 15 arranged on the contact body 11 of the electrical contact 10 according to the second preferred embodiment as described above. For example, the anti-wicking region of the various preferred embodiments may be located about 1 mm above the bottom of the contact tail and may extend about 0.25 mm along the contact body. These dimensions are merely examples and are in no way limiting or restrictive of the various preferred embodiments of the present invention.

The fusible material or solder can be attached to the electrical contact 30 or 30' of the fourth preferred embodiment and its modification, and the electrical contact 40 of the sixth preferred embodiment in a similar manner as the solder 52 is attached to the electrical connector 10 of the second preferred embodiment.

As described above, the laser marking material 34 and the ink 45 are preferably formed in the anti-wicking region along the contact body 30 and 40, respectively, that is located near the contact tail 32, 42, respectively, and is arranged such that, when the solder is reflowed, the solder 52 will not flow past the laser marking material 34 or the ink 45. The closer that the exposed portion of the first preferred embodiment, the laser marking material 34 or 34', and the ink 45, all defining the anti-wicking region, are to the solder, the greater the amount of solder is maintained between the electrical contact 10, 30, 30' and 40, respectively, and the pad 51 of the substrate 53. The more solder 52 that is maintained between the electrical contact 10, 30, 30', and 40 and the pad 51 of the substrate 53, the better the electrical and the mechanical connection.

Figure 5C:
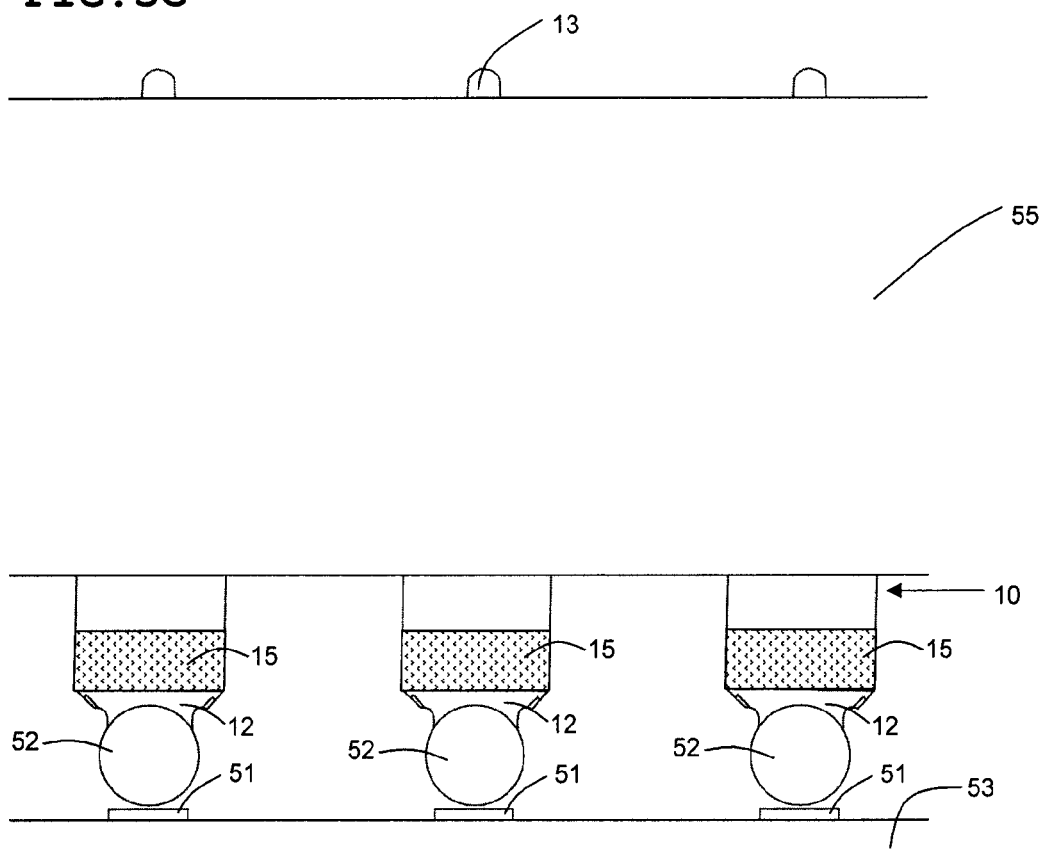
FIGS. 5C and 5D are close-up views of a portion of an electronic apparatus including an electrical connector system having an electrical connector, which includes an electrical contact according to the second preferred embodiment, before and after, respectively, the electrical connector has been attached to a substrate such as a printed circuit board.
Figure 5D:
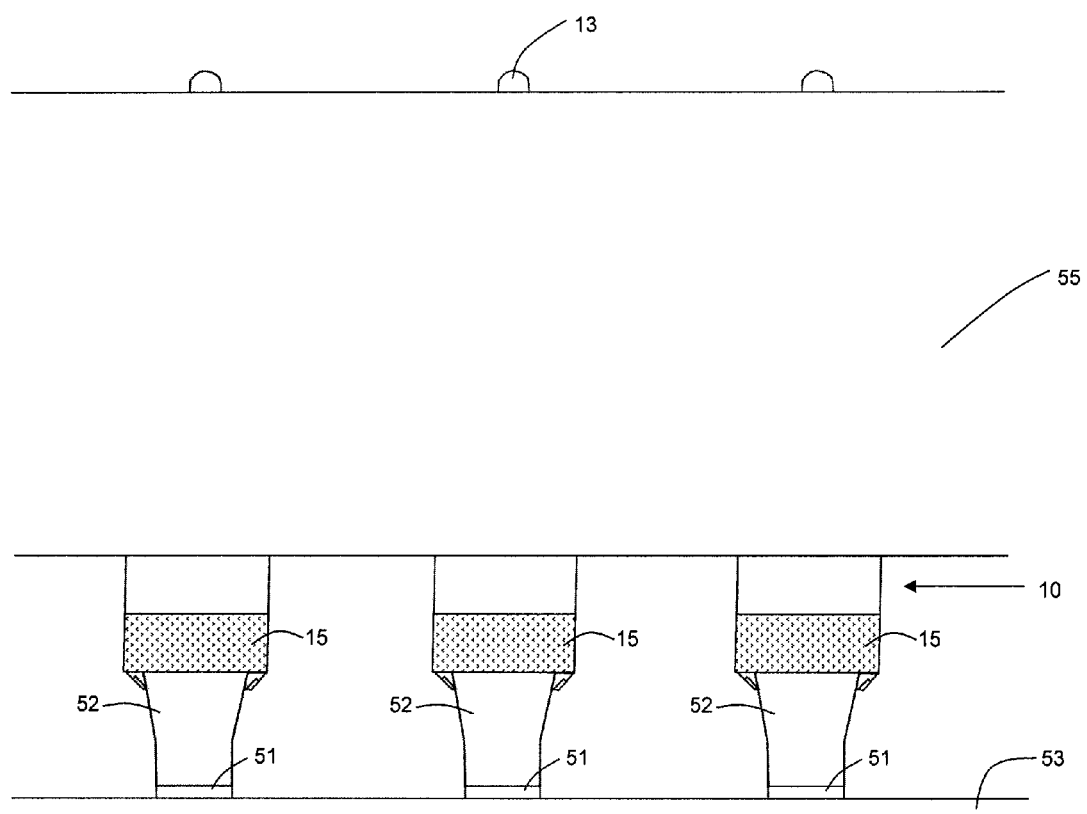
Figure 6:
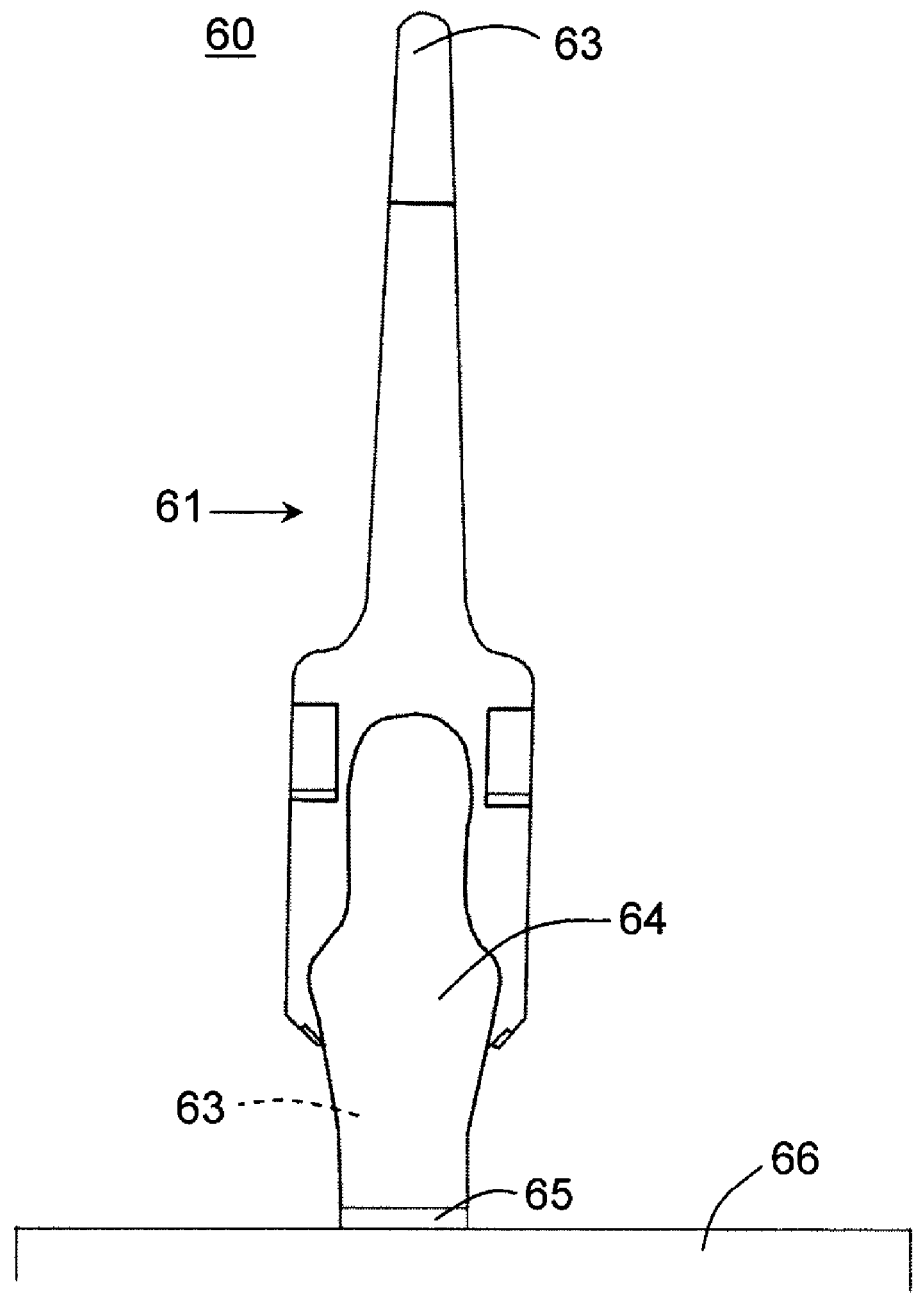
FIG. 6 illustrates a known contact after it has been soldered to a printed circuit board.

FIGS. 5C and 5D are close-up views of a portion of an electronic apparatus including an electrical connector system having an electrical connector 55, including a plurality of electrical contacts 10 according to the second preferred embodiment. FIG. 5C illustrates the electrical connector system before the electrical connector 55 has been attached to a printed circuit board 53. FIG. 5D illustrates the electrical connector system after the electrical connector 55 has been attached to a printed circuit board 53. Although FIGS. 5C and 5D illustrate an electronic apparatus including an electrical connector system that uses an electrical connector 10 according to the second preferred embodiment, the electrical connector system can also use the electrical contacts 30, 30', and 40 according to the fourth preferred embodiment, the modification of the fourth preferred embodiment, and the sixth preferred embodiments, respectively.

It should be noted that the fusible material referred to herein in the description of the various preferred embodiments of the present invention is preferably solder. However, other fusible materials may be used and other fusible material anti-wicking processes and materials may be applied to the contact body of an electrical contact in accordance with the preferred embodiments described herein to prevent the fusible material from wicking up along a length of the contact body and away from the interface between the contact tail and a contact pad located on a substrate to which the contact is to be attached.

The methods of manufacturing an electrical contact 10, 30, 30', and 40 of first, third, and fifth preferred embodiments, respectively, require a minimal amount of time and cost because they can be done in line with other processes, such as the final assembly of the electrical contacts 10, 30, 30' and 40 into an electrical connector. Further, the methods of manufacturing an electrical contact 10, 30, 30', and 40 of first, third, modification of the third, and fifth preferred embodiments, respectively, can be used to manufacture electrical contacts of various sizes. That is, these methods are scalable.

It should be understood that the foregoing description is only illustrative of the present invention. Various alternatives and modifications can be devised by those skilled in the art without departing from the present invention. Accordingly, the present invention is intended to embrace all such alternatives, modifications and variations that fall within the scope of the appended claims.

What is claimed is:

1. An electrical contact for an electrical connector comprising:
   a contact body;
   a contact tail connected to the contact body;
   a contact head connected to the contact body;
   a fusible member; and
   an ink permanently disposed on the contact body; wherein
   the ink is arranged on the contact body such that, when the electrical contact is connected to a substrate, the fusible member is prevented from wicking into the region in which the ink is disposed.

2. An electrical contact according to claim 1, wherein the ink is a high temperature ink.

3. An electrical contact according to claim 1, wherein the fusible element is crimped between two arms extending from the contact tail.

4. An electrical contact according to claim 3, wherein the ink is resistant to a temperature of up to at least the reflow temperature of the fusible element.

5. An electrical contact according to claim 1, wherein the contact body includes at least one contact layer.

6. An electrical contact according to claim 5, wherein the at least one contact layer includes at least one of a nickel layer, a tin layer, a silver layer, and a gold layer.

7. An electrical contact according to claim 1, wherein the contact body includes one of a copper layer and a copper alloy layer.

8. An electrical contact according to claim 1, wherein the ink extends on at least both major surfaces of the contact body.

9. An electrical contact according to claim 1, wherein the ink is disposed on one of (a) a base layer of the electrical contact, and (b) at least one contact layer disposed on the base layer of the electrical contact.

10. An electrical contact according to claim 1, wherein the ink is a chemical resistant ink.

11. An electrical connector comprising an electrical contact according to claim 1.

12. An electronic apparatus comprising:
    a substrate having at least one electrical contact member disposed on a surface thereof; and
    an electrical connector according to claim 11 disposed on the substrate and electrically connected to the at least one electrical contact member.

13. An electrical contact for an electrical connector comprising:
    a contact body including a base layer and at least one contact layer disposed on the base layer;
    a contact tail connected to the contact body;
    a contact head connected to the contact body;
    a fusible member; and
    an ink permanently disposed on the at least one contact layer of the contact body; wherein
    the ink is arranged on the contact body such that, when the electrical contact is connected to a substrate, the fusible member is prevented from wicking into the region in which the ink is disposed.

14. An electrical contact according to claim 13, wherein the ink is a high temperature ink.

15. An electrical contact according to claim 13, wherein the fusible element is crimped between two arms extending from the contact tail.

16. An electrical contact according to claim 15, wherein the ink is resistant to a temperature of up to at least the reflow temperature of the fusible element.

17. An electrical contact according to claim 13, wherein the at least one contact layer includes at least one of a nickel layer, a tin layer, a silver layer, and a gold layer.

18. An electrical contact according to claim 13, wherein the base layer includes one of a copper layer and a copper alloy layer.

19. An electrical contact according to claim 13, wherein the ink extends on at least both major surfaces of the contact body.

20. An electrical contact according to claim 13, wherein the ink is a chemical resistant ink.

* * * * *